United States Patent
Unami et al.

(10) Patent No.: US 10,333,490 B2
(45) Date of Patent: Jun. 25, 2019

(54) PIEZOELECTRIC VIBRATOR AND FREQUENCY ADJUSTMENT METHOD FOR PIEZOELECTRIC VIBRATOR

(71) Applicant: Murata Manufacturing Co., Ltd., Nagaokakyo-shi, Kyoto-fu (JP)

(72) Inventors: Toshihiko Unami, Nagaokakyo (JP); Eitaro Kameda, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 351 days.

(21) Appl. No.: 15/181,771

(22) Filed: Jun. 14, 2016

(65) Prior Publication Data
US 2016/0294355 A1 Oct. 6, 2016

Related U.S. Application Data

(63) Continuation of application No. PCT/JP2014/080641, filed on Nov. 19, 2014.

(30) Foreign Application Priority Data

Dec. 27, 2013 (JP) ................................ 2013-272370

(51) Int. Cl.
*H03H 9/15* (2006.01)
*H03H 3/007* (2006.01)
(Continued)

(52) U.S. Cl.
CPC ............ *H03H 9/15* (2013.01); *H03H 3/0077* (2013.01); *H03H 3/04* (2013.01); *H03H 9/215* (2013.01);
(Continued)

(58) Field of Classification Search
CPC .......... H03H 9/15; H03H 3/0077; H03H 3/04; H03H 2003/0492
See application file for complete search history.

(56) References Cited

U.S. PATENT DOCUMENTS

2006/0170305 A1* 8/2006 Ohshima ................. H03H 3/04
  310/311
2010/0013360 A1* 1/2010 Baborowski ............ H03H 3/04
  310/370
(Continued)

FOREIGN PATENT DOCUMENTS

JP    2007324513 A    12/2007
JP    2010118784 A     5/2010
(Continued)

OTHER PUBLICATIONS

International Search Report issued for PCT/JP2014/080641, dated Feb. 3, 2015.
(Continued)

*Primary Examiner* — Bryan P Gordon
(74) *Attorney, Agent, or Firm* — Arent Fox LLP

(57) ABSTRACT

A frequency adjustment method is provided in which a residual substance is unlikely to be generated, the frequency can be adjusted with high precision, and a decrease in strength is made small.

A frequency adjustment method for a piezoelectric vibrator includes preparing the piezoelectric vibrator having a base portion, a vibration arm that includes a connection portion connected to the base portion as well as vibration arm main bodies extending from the connection portion and that is made of a single crystal, a lower electrode formed on the vibration arm, a piezoelectric thin film formed on the lower electrode, and an upper electrode formed on the piezoelectric thin film; and forming an alteration portion by irradiating the connection portion with a laser beam.

18 Claims, 2 Drawing Sheets

(51) Int. Cl.
*H03H 9/215* (2006.01)
*H03H 9/24* (2006.01)
*H03H 3/04* (2006.01)

(52) U.S. Cl.
CPC ... *H03H 9/2457* (2013.01); *H03H 2003/0421* (2013.01); *H03H 2003/0492* (2013.01)

(56) References Cited

U.S. PATENT DOCUMENTS

| | | |
|---|---|---|
| 2010/0117490 A1 | 5/2010 | Takahashi et al. |
| 2011/0117490 A1* | 5/2011 | Bae .................. G03F 7/0035 430/270.1 |
| 2013/0076211 A1* | 3/2013 | Arimatsu ............ G04R 20/10 310/370 |

FOREIGN PATENT DOCUMENTS

| | | |
|---|---|---|
| JP | 2011160391 A | 8/2011 |
| JP | 2012080284 A | 3/2012 |
| WO | WO 2011043357 A1 | 4/2011 |

OTHER PUBLICATIONS

Written Opinion of the International Searching Authority issued for PCT/JP2014/080641, dated Feb. 3, 2015.

* cited by examiner

PIEZOELECTRIC VIBRATOR AND FREQUENCY ADJUSTMENT METHOD FOR PIEZOELECTRIC VIBRATOR

CROSS REFERENCE TO RELATED APPLICATIONS

The present application is a continuation of PCT/JP2014/080641 filed Nov. 19, 2014, which claims priority to Japanese Patent Application No. 2013-272370, filed Dec. 27, 2013, the entire contents of each of which are incorporated herein by reference.

FIELD OF THE INVENTION

The present disclosure relates to a piezoelectric vibrator using a piezoelectric thin film and a frequency adjustment method for a piezoelectric vibrator.

BACKGROUND OF THE INVENTION

Currently, there exist a variety of methods for adjusting a frequency of a piezoelectric vibrator having a plurality of vibration arms.

In a frequency adjustment method disclosed in Patent Document 1 cited below, a piezoelectric vibrator disposed in a package is irradiated with a femtosecond laser. This makes it possible to remove a mass film or a base material of the piezoelectric vibrator so as to adjust the frequency while suppressing damage to the package. A wave length of the laser is defined to be no less than 1200 nm.

In a frequency adjustment method disclosed in Patent Document 2 cited below, a quartz tuning fork vibrator disposed in a package is irradiated with a laser. An adjustment film on a leading end of the quartz tuning fork vibrator scatters when removed by the laser. In order to prevent the adjustment film that has scattered from reattaching to the quartz tuning fork vibrator, a projection is provided on an inner wall of the package.

In addition, there is disclosed a method in which an alteration layer having a different crystal structure from a portion surrounding the stated alteration layer is provided by laser irradiation.

Patent Document 3, cited below, discloses that an alteration layer is provided in a vibration arm of a tuning fork vibrator where a piezoelectric thin film is formed on a quartz or Si substrate by irradiating the vibration arm with a femtosecond laser. To be more specific, the alteration layer is provided within a range of 0.4 to 0.6 times the length of the vibration arm. This suppresses the secondary mode. Note that Patent Document 3 does not disclose a frequency adjustment method.

Patent Document 1: WO 2011/043357.
Patent Document 2: Japanese Unexamined Patent Application Publication No. 2010-118784.
Patent Document 3: Japanese Unexamined Patent Application Publication No. 2011-160391.

With the method in Patent Document 1, there is a case in which a mass film having been removed by the laser scatters within the package and reattaches to the piezoelectric vibrator, thereby causing deviation from the target frequency. Further, when the mass film having reattached is gasified over time, a variation in frequency or the like occurs to make the characteristics likely to be unstable. Furthermore, there is a risk of a short circuit in the case where the mass film is attached between electrode patterns. In addition, in the case where a surface of the piezoelectric vibrator is irradiated with the laser, a residual substance is formed on the periphery. As such, in the case where the residual substance is attached to a section of vibration, the vibration is obstructed and there arises a risk of a Q-value being lowered, especially at a time of large amplitude driving.

With the method in Patent Document 2, providing a projection on the inner wall of the package makes a height of the package larger and raises a problem that a quartz vibration device becomes large in size. In addition, even if the projection is provided on the inner wall of the package, in the case where a gasified adjustment film moves within the package, the stated gasified film cannot be completely prevented from reattaching to the quartz tuning fork vibrator.

With the method in Patent Document 3, providing an alteration layer in the vibration arm is likely to lower the strength of the vibration arm. In particular, as the amplitude of the vibration is larger, the strength is likely to be significantly lowered because repetitive stress becomes larger.

SUMMARY OF THE INVENTION

An object of the present invention is to provide a frequency adjustment method in which a residual substance is unlikely to be generated, the frequency can be adjusted with high precision, and a drop in the strength is small. Further, another object of the present invention is to provide a piezoelectric vibrator on which frequency adjustment has been carried out in the manner described above, and which is highly stable and has a high Q-value.

A piezoelectric vibrator according to an exemplary embodiment includes a base, a vibration arm connected to the base portion and made of a single crystal, a lower first electrode formed on the vibration arm, a piezoelectric thin film formed on the lower electrode, and an upper second electrode formed on the piezoelectric thin film. In the stated piezoelectric vibrator, the vibration arm includes a connection portion connected to the base portion and a plurality of vibration arm main bodies extending from the connection portion; an alteration portion is provided in the connection portion; and an out-of-plane bending vibration mode is used.

In a specific aspect of the piezoelectric vibrator, the alteration portion is formed inside the connection portion and does not reach a surface of the connection portion.

In another specific aspect of the piezoelectric vibrator according to the present invention, the vibration arm is made of either Si or quartz.

A frequency adjustment method for a piezoelectric vibrator according to the present invention includes preparing a piezoelectric vibrator having a base, a vibration arm that includes a connection portion connected to the base portion as well as a plurality of vibration arm main bodies extending from the connection portion and that is made of a single crystal, a lower first electrode formed on the vibration arm, a piezoelectric thin film formed on the lower electrode, and an second upper electrode formed on the piezoelectric thin film. The method further includes forming an alteration portion by irradiating the connection portion with a laser beam.

In a specific aspect of the frequency adjustment method for the piezoelectric vibrator, the connection portion is irradiated with a laser beam from a side opposite to a surface of the connection portion where the lower electrode is formed.

In another specific aspect of the frequency adjustment method for the piezoelectric vibrator, the connection portion is irradiated with a laser beam in a state where the piezoelectric vibrator is sealed with a package material.

According to the piezoelectric vibrator and the frequency adjustment method for the piezoelectric vibrator according to the present invention, when the frequency adjustment is carried out, an effect on a surface of the piezoelectric vibrator is unlikely to be generated, the electrode is unlikely to scatter, and a residual substance is also unlikely to be generated. This makes it possible to adjust a frequency with high precision. In addition, a drop in the strength due to the frequency adjustment is small. Moreover, a piezoelectric vibrator having a high Q-value as well as stable characteristics can be provided.

DETAILED DESCRIPTION OF EXEMPLARY EMBODIMENTS

Hereinafter, the present invention will be clarified through descriptions of the specific embodiments of the present invention with reference to the drawings.

Figure 1A:
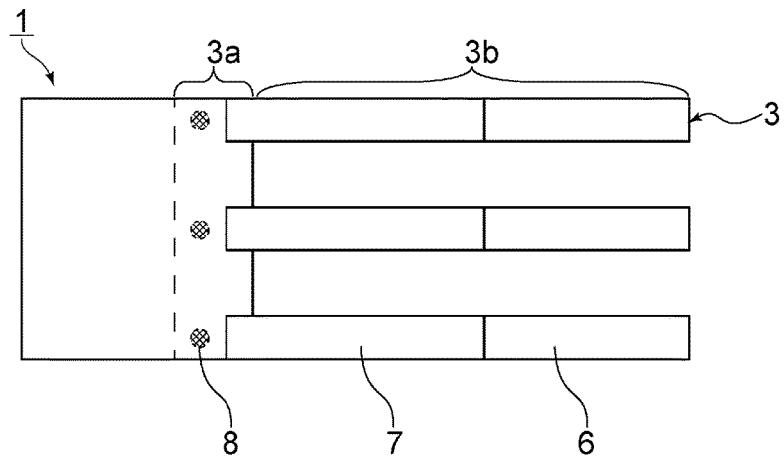
FIG. 1(a) and FIG. 1(b) are respectively a plan view and a cross-sectional side view of a piezoelectric vibrator according to a first embodiment of the present invention.
Figure 1B:
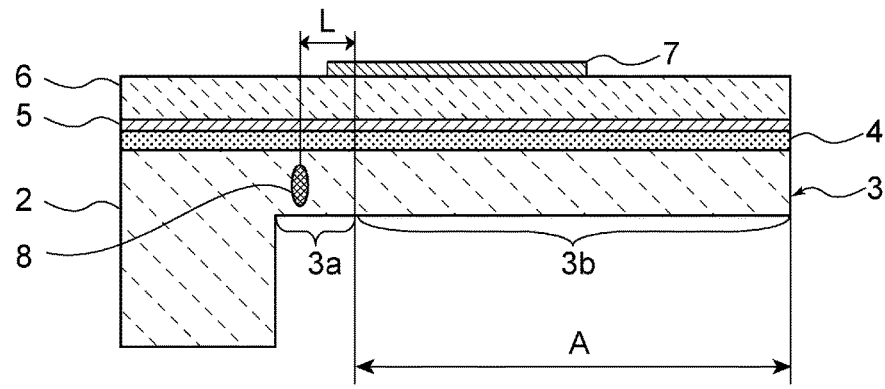

FIG. 1(a) is a plan view of a piezoelectric vibrator according to a first embodiment of the present invention, and FIG. 1(b) is a cross-sectional side view of the piezoelectric vibrator according to the first embodiment of the present invention.

As shown in FIGS. 1(a) and 1(b), a piezoelectric vibrator 1 includes a base portion 2 and a vibration arm 3 connected to the base portion 2. The vibration arm 3 includes a connection portion 3a connected to the base portion 2, and a plurality of vibration arm main bodies 3b extending in parallel with each other from the connection portion 3a. Each of the vibration arm main bodies 3b is formed in a strip shape extending in a lengthwise direction. One end of each vibration arm main body 3b is connected to the connection portion 3a. The connection portion 3a extends in a width direction of the vibration arm main bodies 3b and these vibration arm main bodies 3b are connected to the connection portion 3a. A thickness of the connection portion 3a is equal to a thickness of the vibration arm main body 3b and smaller than a thickness of the base portion 2.

In the present embodiment, the base portion 2 and the vibration arm 3 are each configured with a single crystal of Si. The base portion 2 and the vibration arm 3 may be configured with a single crystal of a material other than Si, such as quartz or the like. It is preferable that the base portion 2 and the vibration arm 3 be integrally configured with the same material as the present embodiment. Note that, however, the base portion 2 and the vibration arm 3 may be configured with different materials from each other.

A temperature characteristics correction film 4 made of $SiO_2$ is formed on the vibration arm 3. A lower electrode 5 is formed on the temperature characteristics correction film 4. A piezoelectric thin film 6 is formed on the lower electrode 5. An upper electrode 7 is formed on the piezoelectric thin film 6. Note that the temperature characteristics correction film 4 is not included according to an alternative embodiment.

In the present embodiment, the upper electrode 7 and the lower electrode 5 are formed from Mo. The piezoelectric thin film 6 is formed from ZnO. Note that the upper electrode 7 and the lower electrode 5 may be formed from an appropriate metal other than Mo, such as an alloy, or the like. The piezoelectric thin film 6 may be formed from a material other than ZnO, that is, an appropriate piezoelectric ceramics such as AlN or the like may be used.

An alteration portion 8 is formed in the connection portion 3a. The alteration portion 8 is a portion where the crystallinity of a base material forming the connection portion 3a has been altered and its composition structure is different from a portion surrounding the stated alteration portion 8. Although the connection portion 3a is made of a single crystal, the alteration portion 8 is formed to be an amorphous, polycrystalline, or vacant state. Alternatively, the alteration portion 8 is formed to be a mixture of the amorphous, polycrystalline, and vacant states, or formed to be a state in which the amorphous, polycrystalline, and vacant states are mixed, or these and a crystal as a base material of the connection portion 3a are mixed together.

In the present embodiment, the alteration portion 8 is formed in a region of the connection portion 3a extended from the vibration arm main body 3b when viewed from above. A single alteration portion 8 is formed in each region extended from each of the vibration arm main bodies 3b. The alteration portion 8 is formed inside the connection portion 3a and does not reach the surface of the connection portion 3a. Note that the plurality of alteration portions 8 may be formed in a region extended from each of the vibration arm main bodies 3b. Moreover, the alteration portion 8 may be formed in a section other than the above-mentioned region extended from each of the vibration arm main bodies 3b. In such case, the alteration portion 8 may not be formed in the region extended from each of the vibration arm main bodies 3b.

A frequency adjustment method for the piezoelectric vibrator according to the present embodiment will be hereinafter described.

The piezoelectric vibrator 1 is prepared to include the base portion 2 and the vibration arm 3 having the connection portion 3a connected to the base portion 2 as well as the plurality of vibration arm main bodies 3b extending in parallel with each other from the connection portion 3a. A focal point of a laser beam is adjusted to the interior of the connection portion 3a, and then the connection portion 3a is irradiated with the laser beam. This forms the alteration portion 8 in the connection portion 3a and adjusts a frequency of the piezoelectric vibrator 1.

In the connection portion 3a, because a portion where the alteration portion 8 is provided has a low crystallinity and consequently has a low Young's modulus, the frequency is lowered. Further, since the connection portion 3a corresponds to the base of the vibration arm 3, a large stress is applied to the connection portion 3a. Accordingly, by forming the alteration portion 8 in the connection portion 3a, the frequency of the piezoelectric vibrator 1 can be effectively adjusted.

When the direction orthogonal to the length of the vibration arm main body 3b is considered as the width direction of the vibration arm main body 3b, a width direction dimension of the vibration arm main body 3b can be small. As such, if the alteration portion 8 is formed in the vibration arm main body 3b, the strength thereof is significantly lowered. However, according to the adjustment method of the present embodiment, the alteration portion 8 is formed in the connection portion 3a having a large width, which makes it possible to adjust the frequency while ensuring the strength.

In the present embodiment, by irradiating the connection portion 3a with a laser beam, the alteration portion 8 is formed. According to an exemplary embodiment, a femtosecond laser with a wave length of 1200 nm is used. By adjusting a focal point of the laser beam to the interior of the connection portion 3a by using a lens or the like, the alteration portion 8 can be formed inside the connection portion 3a. The wave length of the laser beam is not limited to any specific one, as long as the wave length falls within a range where the focal point of the laser beam can be adjusted to the interior of the connection portion 3a to form the alteration portion 8 therein.

Like the method disclosed in Patent Document 1, for example, if the frequency adjustment is carried out by removing a mass film provided on the vibration arm, the mass film having been removed by the laser beam scatters and reattaches to the piezoelectric vibrator in some case. This causes deviation from the target frequency in some case. Further, in the case where the mass film having reattached is gasified over time, a variation in the frequency or the like occurs so that the characteristics become unstable in some case. Furthermore, there is a risk of a short circuit if the mass film is attached between electrode patterns. In addition, when a laser beam whose focal point is adjusted to the surface of the piezoelectric vibrator strikes the piezoelectric vibrator, a residual substance is formed on the periphery. In the case where the residual substance is attached to a section of vibration, the vibration is obstructed and a Q-value is lowered in some case.

In the present embodiment, however, the focal point of a laser beam is positioned to the interior of the connection portion 3a. This makes it possible for the alteration portion 8 to be formed only inside the connection portion 3a and provided so as not to reach the surface. Accordingly, influence on the surface of the piezoelectric vibrator 1 is further unlikely to be generated. Furthermore, the electrode is unlikely to scatter and a residual substance that interferes with the vibration is also unlikely to be formed. Accordingly, the frequency can be adjusted with high precision. As such, the piezoelectric vibrator 1 having a high Q-value as well as stable characteristics can be provided.

Figure 2:
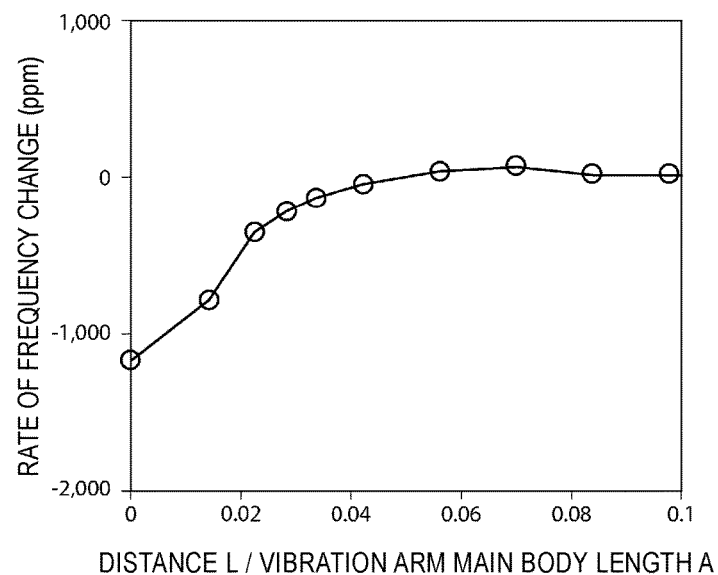
FIG. 2 is a graph illustrating a relationship between a rate of frequency change and a defined distance obtained by "distance L/vibration arm main body length A", where the distance L is a distance to the center of an alteration portion from an end portion of a connection portion on a side where a vibration arm main body is connected and the vibration arm main body length A is a length of the vibration arm main body.

Next, with the piezoelectric vibrator 1 according to the above-described embodiment, a change in frequency was simulated while changing a distance "L" to the center of the alteration portion 8 from an end portion of the connection portion 3a on a side where the vibration arm main body 3b is connected. Then, a rate of change in frequency was researched before/after the formation of the alteration portion 8. Note that the distance L was defined with a length of the vibration arm main body 3b represented as "A". FIG. 2 is a graph illustrating a relationship between a value of distance L/vibration arm main body length A and the rate of change in frequency.

In the simulation, the number of the vibration arm main bodies 3b was three and the vibration arm main bodies 3b are the same in size. The length, width, and thickness of the vibration arm main body 3b were set to be 360 µm, 20 µm, and 10 µm, respectively. Further, intervals between the vibration arm main bodies 3b were each set to be 20 µm. Thicknesses of the upper electrode 7 and the lower electrode 5 were both set to be 0.1 µm. Thickness of the piezoelectric thin film 6 was set to be 0.8 µm. A resonant frequency was set to be 32 kHz. The alteration portion 8 was formed in a substantially circular shape when viewed from above, the diameter thereof was set to be 2 µm, and a dimension of the alteration portion 8 along the thickness direction was set to be 4 µm. Further, the alteration portion 8 was a vacancy.

When the value of distance L/vibration arm main body length A is no more than 0.04, the frequency decreases. When the value of distance L/vibration arm main body length A is no more than 0.02, the frequency significantly decreases in particular. In this manner, by adjusting a location where the alteration portion 8 is formed, the frequency can be adjusted. Further, since the change in frequency is large when the value of distance L/vibration arm main body length A is no more than 0.02, the frequency can be largely adjusted in particular. In the simulation, the alteration portion was a vacancy. However, the frequency can also be adjusted to a low frequency side by causing the alteration portion to be amorphous or the like so as to realize a low Young's modulus.

The frequency can be adjusted not only by the location but also by the size of the alteration portion 8, the number of the alteration portions 8, or the like.

Figure 3:
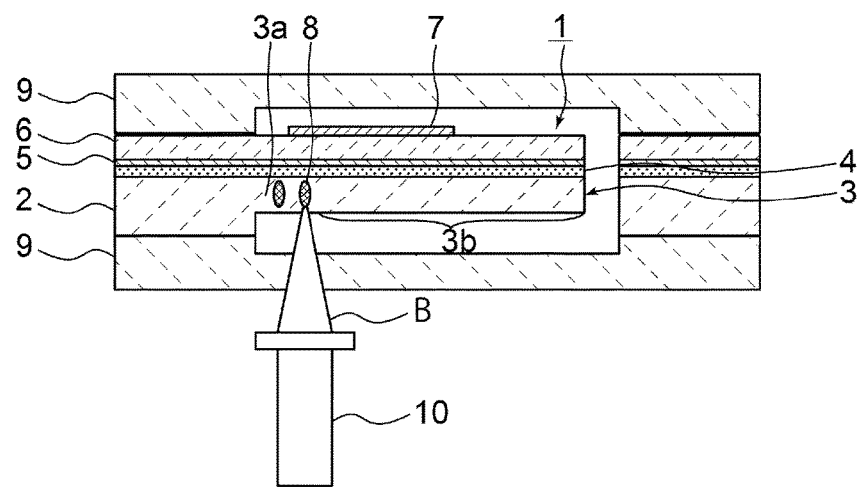
FIG. 3 is a schematic cross-sectional side view illustrating a frequency adjustment method for a piezoelectric vibrator according to a second embodiment of the present invention.

FIG. 3 is a schematic cross-sectional side view illustrating a frequency adjustment method for a piezoelectric vibrator according to a second embodiment of the present invention.

In this embodiment, the connection portion 3a is irradiated with a laser beam B in a state where the piezoelectric vibrator 1 is sealed with a package material 9. To be more specific, the laser beam B is radiated from a laser oscillator 10 installed on a side opposite to the surface of the connection portion 3a where the lower electrode 5 is formed. By setting the focal point of the laser beam B to a location inside the connection portion 3a by using a lens or the like, the frequency of the piezoelectric vibrator 1 can be adjusted even in a state where the piezoelectric vibrator 1 is sealed. Through this, the alteration portion 8 can be provided inside the connection portion 3a without the radiated laser beam B passing through the upper electrode 7, the piezoelectric thin film 6, and the lower electrode 5. As such, influence on the surface of the piezoelectric vibrator 1 is further unlikely to be generated. In addition, the electrode is unlikely to scatter and a residual substance is also unlikely to be formed. Accordingly, the frequency can be adjusted with high precision. Moreover, a piezoelectric vibrator having a high Q-value as well as stable characteristics can be provided.

REFERENCE SIGNS LIST

PIEZOELECTRIC VIBRATOR
BASE PORTION
VIBRATION ARM
3a CONNECTION PORTION
3b VIBRATION ARM MAIN BODY
TEMPERATURE CHARACTERISTICS CORRECTION FILM
LOWER ELECTRODE
PIEZOELECTRIC THIN FILM
UPPER ELECTRODE
ALTERATION PORTION
PACKAGE MATERIAL
LASER OSCILLATOR

The invention claimed is:

1. A piezoelectric vibrator comprising:
   a base formed of a single crystal;
   a vibration arm formed of the single crystal and including a connection portion coupled to the base and a plurality of vibration strips extending from the connection portion;
   a first electrode disposed above the vibration arm;
   a piezoelectric thin film disposed on the first electrode; and
   an second electrode disposed on the piezoelectric thin film,
   wherein the connection portion includes at least one alteration portion formed inside the connection portion of the vibration arm and having a composition structure different than the single crystal of the base and the vibration arm.

2. A piezoelectric vibrator, comprising:
   a base formed of a single crystal;
   a vibration arm formed of the single crystal and including a connection portion coupled to the base and a plurality of vibration strips extending from the connection portion;
   a first electrode disposed above the vibration arm;
   a piezoelectric thin film disposed on the first electrode; and
   an second electrode disposed on the piezoelectric thin film,
   wherein the connection portion includes at least one alteration portion formed inside the connection portion and having a composition structure different than the single crystal of the base and the vibration arm, and
   wherein the at least one alteration portion is formed inside the connection portion and does not extend to a surface of the connection portion.

3. The piezoelectric vibrator according to claim 1, wherein the single crystal is either silicon or quartz.

4. The piezoelectric vibrator according to claim 1, wherein the composition structure of the at least one alteration portion comprises a crystallinity composition that is one of an amorphous state, a polycrystalline state, or vacant state.

5. The piezoelectric vibrator according to claim 1, wherein the plurality of vibration strips extend in a lengthwise direction parallel to one another.

6. The piezoelectric vibrator according to claim 5, wherein the connection portion includes a plurality of alteration portions formed in the connection portion adjacent each of the plurality of vibration strips, respectively.

7. The piezoelectric vibrator according to claim 6, wherein the plurality of alteration portions are formed in regions extended from each of the plurality of vibration strips.

8. The piezoelectric vibrator according to claim 1,
   wherein the connection portion comprises a width that is orthogonal to a lengthwise direction of each of the plurality of vibration strips, and
   wherein the width of the connection portion is equal to a width of the base.

9. The piezoelectric vibrator according to claim 1, wherein the second electrode has a length in a lengthwise direction of the plurality of vibration strips that is shorter than a length of the first electrode.

10. The piezoelectric vibrator according to claim 1, further comprising a temperature characteristics correction film disposed between the first electrode and the vibration arm.

11. The piezoelectric vibrator according to claim 2, wherein the single crystal is either silicon or quartz.

12. The piezoelectric vibrator according to claim 2, wherein the composition structure of the at least one alteration portion comprises a crystallinity composition that is one of an amorphous state, a polycrystalline state, or vacant state.

13. The piezoelectric vibrator according to claim 2, wherein the plurality of vibration strips extend in a lengthwise direction parallel to one another.

14. The piezoelectric vibrator according to claim 13, wherein the connection portion includes a plurality of alteration portions formed in the connection portion adjacent each of the plurality of vibration strips, respectively.

15. The piezoelectric vibrator according to claim 14, wherein the plurality of alteration portions are formed in regions extended from each of the plurality of vibration strips.

16. The piezoelectric vibrator according to claim 2,
   wherein the connection portion comprises a width that is orthogonal to a lengthwise direction of each of the plurality of vibration strips, and
   wherein the width of the connection portion is equal to a width of the base.

17. The piezoelectric vibrator according to claim 2, wherein the second electrode has a length in a lengthwise direction of the plurality of vibration strips that is shorter than a length of the first electrode.

18. The piezoelectric vibrator according to claim 2, further comprising a temperature characteristics correction film disposed between the first electrode and the vibration arm.

* * * * *